United States Patent
Liu et al.

(10) Patent No.: US 9,842,791 B2
(45) Date of Patent: Dec. 12, 2017

(54) BASE WITH HEAT ABSORBER AND HEAT DISSIPATING MODULE HAVING THE BASE

(71) Applicants: FURUI PRECISE COMPONENT (KUNSHAN) CO., LTD., Kunshan (CN); Foxconn Technology Co., Ltd., New Taipei (TW)

(72) Inventors: Yi-Chang Liu, New Taipei (TW); Jui-Wen Hung, New Taipei (TW); Jian-Zhong Lu, Kunshan (CN)

(73) Assignees: FURUI PRECISE COMPONENT (KUNSHAN) CO., LTD., Kunshan (CN); Foxconn Technology Co., Ltd., New Taipei (TW)

( * ) Notice: Subject to any disclaimer, the term of this patent is extended or adjusted under 35 U.S.C. 154(b) by 0 days.

(21) Appl. No.: 15/235,116

(22) Filed: Aug. 12, 2016

(65) Prior Publication Data
US 2016/0351470 A1    Dec. 1, 2016

Related U.S. Application Data

(62) Division of application No. 13/873,141, filed on Apr. 29, 2013, now Pat. No. 9,449,894.

(30) Foreign Application Priority Data

Nov. 30, 2012    (CN) .......................... 2012 1 0501978

(51) Int. Cl.
| | | |
|---|---|---|
| H01L 23/40 | (2006.01) | |
| H01L 23/427 | (2006.01) | |
| H01L 23/467 | (2006.01) | |
| H01L 23/367 | (2006.01) | |

(52) U.S. Cl.
CPC .......... *H01L 23/4006* (2013.01); *H01L 23/40* (2013.01); *H01L 23/427* (2013.01); *H01L 23/467* (2013.01); *H01L 23/3672* (2013.01); *H01L 2023/4068* (2013.01); *H01L 2023/4081* (2013.01); *H01L 2023/4087* (2013.01); *H01L 2924/0002* (2013.01)

(58) Field of Classification Search
CPC ........................ F28D 15/0275; H01L 23/4006
USPC .......... 165/80.3, 104.33; 361/700, 704, 710; 29/513, 515, 521
See application file for complete search history.

(56) References Cited

U.S. PATENT DOCUMENTS 3,105,295 A * 10/1963 Calhoun et al. ........ F24D 19/04
                                                              165/55
5,237,734 A *  8/1993 Polon ..................... B21D 39/02
                                                              29/243.58
(Continued)

*Primary Examiner* — Allen Flanigan
(74) *Attorney, Agent, or Firm* — ScienBiziP, P.C.

(57) ABSTRACT

An exemplary base includes a heat absorber and clips attached to the heat absorber. The heat absorber includes a top surface and a bottom surface. A pair of receiving grooves is defined in opposite lateral sides of the heat absorber, respectively. Each receiving groove is located above a level of the bottom surface and below a level of the top surface. Each clip includes a positioning beam. The positioning beam is received in a corresponding one of the receiving grooves with a portion of the heat absorber adjacent to the positioning beam deformed and fixed in the positioning beam thereby fixing the positioning beam in the receiving groove. A heat dissipating module having the base is also provided.

4 Claims, 10 Drawing Sheets

(56) References Cited

U.S. PATENT DOCUMENTS

| | | | | |
|---|---|---|---|---|
| 6,029,334 | A * | 2/2000 | Hartley | B21D 39/021 |
| | | | | 29/464 |
| 6,161,611 | A * | 12/2000 | Cheng | H01L 23/4093 |
| | | | | 165/185 |
| 6,470,962 | B1 * | 10/2002 | Pao | H01L 23/4093 |
| | | | | 165/185 |
| 7,347,249 | B2 * | 3/2008 | Lin | H01L 23/4006 |
| | | | | 165/104.33 |
| 8,403,279 | B2 * | 3/2013 | Cao | H01L 23/4006 |
| | | | | 248/223.21 |
| 2002/0070005 | A1 * | 6/2002 | Kawabata et al. | B21D 53/02 |
| | | | | 165/80.3 |
| 2003/0159819 | A1 * | 8/2003 | Lee | H01L 23/4006 |
| | | | | 165/185 |
| 2004/0188080 | A1 * | 9/2004 | Gailus et al. | F28F 13/00 |
| | | | | 165/185 |
| 2006/0120053 | A1 * | 6/2006 | Lee et al. | H01L 23/4006 |
| | | | | 361/704 |
| 2007/0103873 | A1 * | 5/2007 | Lo | G06F 1/183 |
| | | | | 361/710 |
| 2008/0224019 | A1 * | 9/2008 | Luo | H01L 23/4006 |
| | | | | 248/580 |
| 2010/0097766 | A1 * | 4/2010 | Wu et al. | H01L 23/4006 |
| | | | | 361/700 |

* cited by examiner

BASE WITH HEAT ABSORBER AND HEAT DISSIPATING MODULE HAVING THE BASE

CROSS-REFERENCE TO RELATED APPLICATIONS

This is a division application. This application claims priority to TW Patent Application No. 201210501978.7 filed on Nov. 30, 2012, the contents of which are incorporated by reference herein.

FIELD

The disclosure relates to heat dissipating modules used for dissipating heat generated from electronic components in electronic devices, and more particularly to a base with a heat absorber and a heat dissipating module having the base.

BACKGROUND

With the continuing development of electronics technology, many electronic components are nowadays made in a small size but with a high operating frequency capability. For example, electronic packages such as CPUs (central processing units), when employed in electronic devices, may run at very high speeds and generate a lot of heat. A heat dissipation module is commonly installed in such kind of electronic device, in contact with the CPU for quickly dissipating the generated heat.

The heat dissipation module typically includes a base attached to the electronic component, a heat pipe thermally connecting the base, a fin assembly mounted on the base, and clips for securing the heat dissipation module to a circuit board on which the electronic component is mounted. A top surface of each clip normally resists a bottom surface of the base. A plurality of through holes is defined in the clips and the base. The heat dissipating module is attached to the circuit board with screws extending through the through holes. However, the screws are prone to loosen when the heat dissipation module has been in service for a long time. When this happens, the clips cannot tightly contact the base, the base is no longer firmly attached to the electronic component, and the heat dissipation efficiency of the heat dissipation module is thus reduced. Furthermore, because of the need for the screws, the process of assembly is somewhat complicated, and manufacturing costs are increased.

Therefore, it is desirable to provide a heat dissipating module having a base which can overcome the above-described problems.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present heat dissipating module. Moreover, in the drawings, all the views are schematic, and like reference numerals designate corresponding parts throughout the views.

DETAILED DESCRIPTION OF EMBODIMENTS

Figure 1:
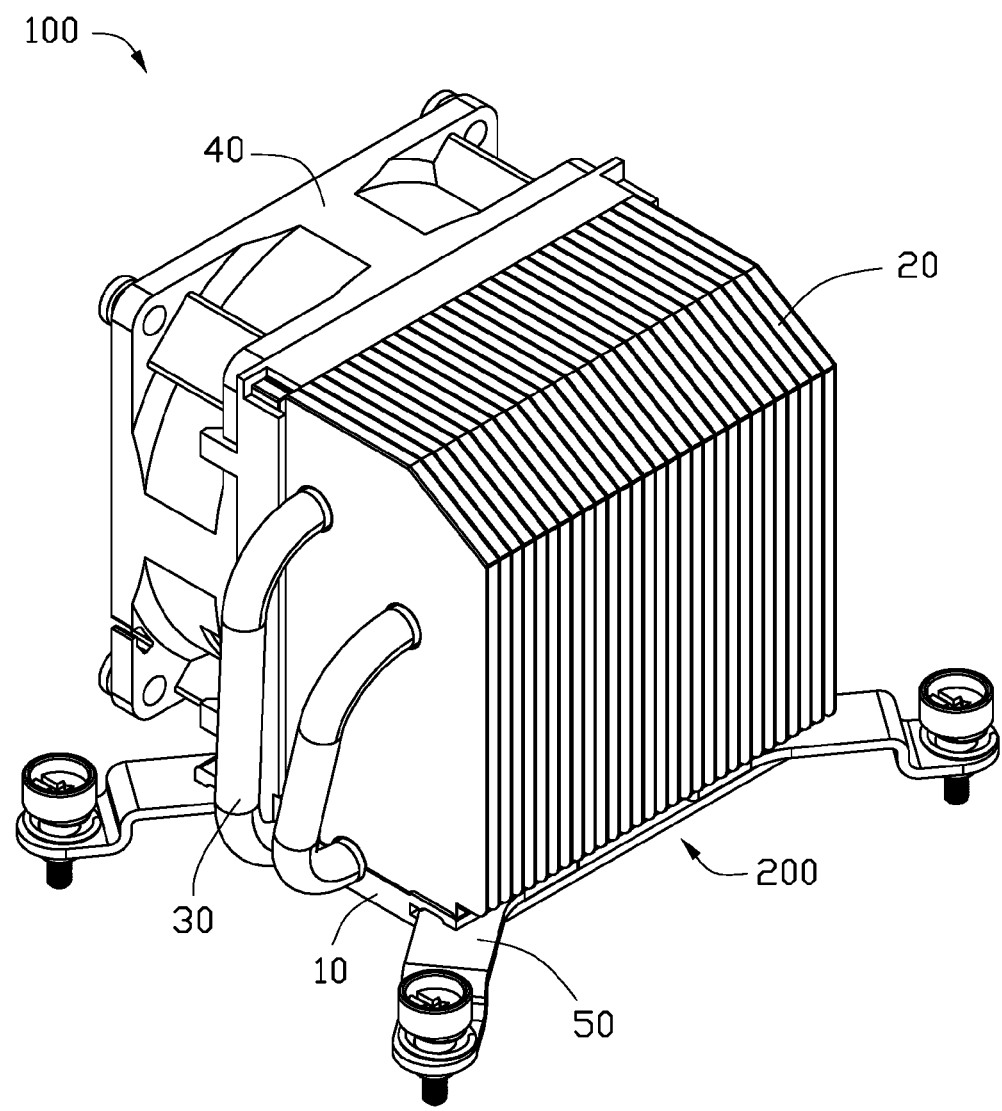
FIG. 1 is an assembled, isometric view of a heat dissipating module in accordance with a first embodiment of the disclosure, the heat dissipating module including a base and a plurality of clips.
Figure 2:
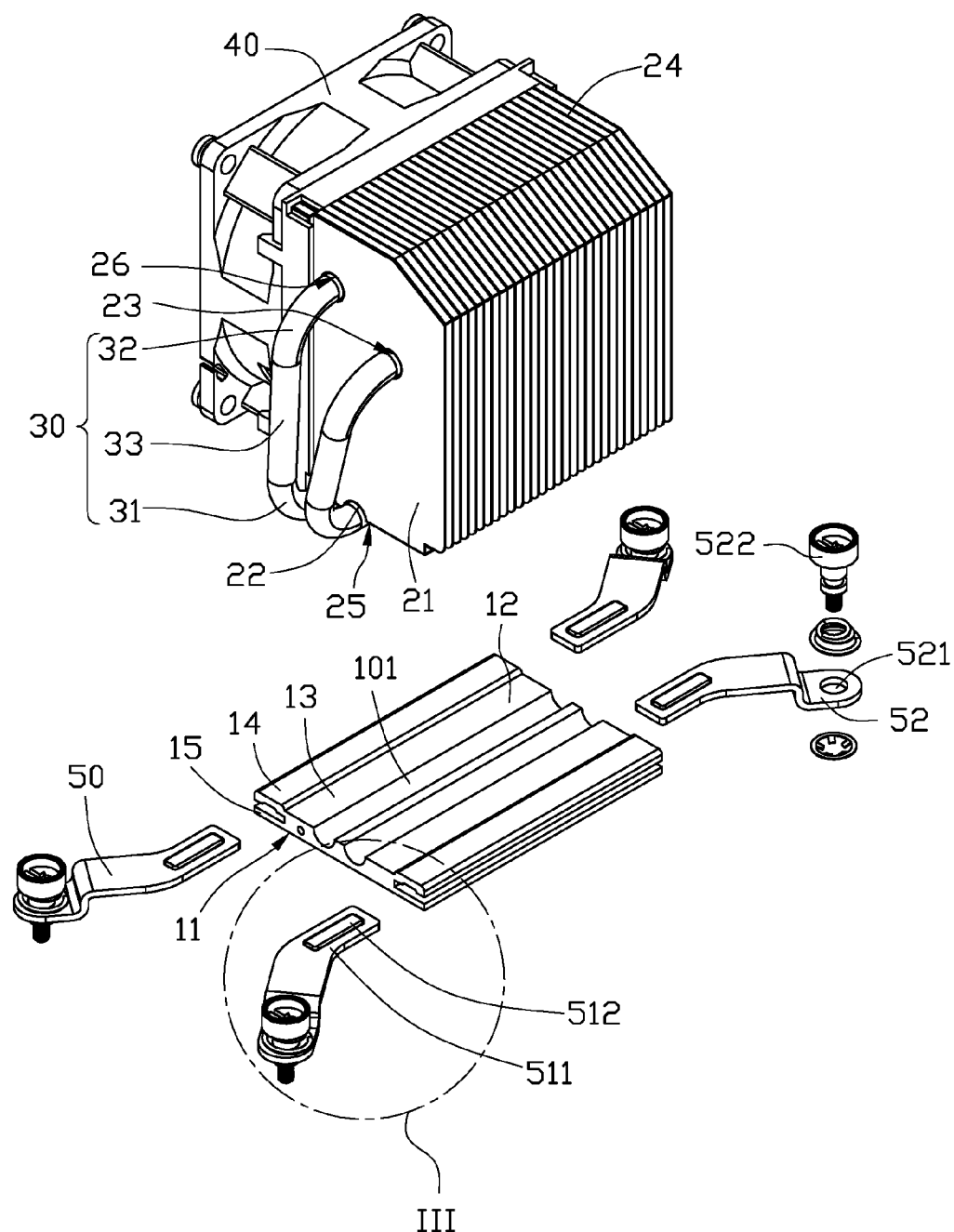
FIG. 2 is an exploded view of the heat dissipating module of FIG. 1.

Referring to FIG. 1 and FIG. 2, a heat dissipating module 100 in accordance with a first exemplary embodiment is provided. The heat dissipating module 100 includes a base 200, a fin assembly 20 mounted on the base 200, a pair of heat pipes 30, and a fan 40. The pair of heat pipes 30 are inserted through the fin assembly 20. The fan 40 is located at one side of the fin assembly 20. The base 200 includes a heat absorber 10, and a plurality of clips 50 combined to the heat absorber 10 for securing the heat dissipating module 100 to a circuit board (not shown).

Figure 3:
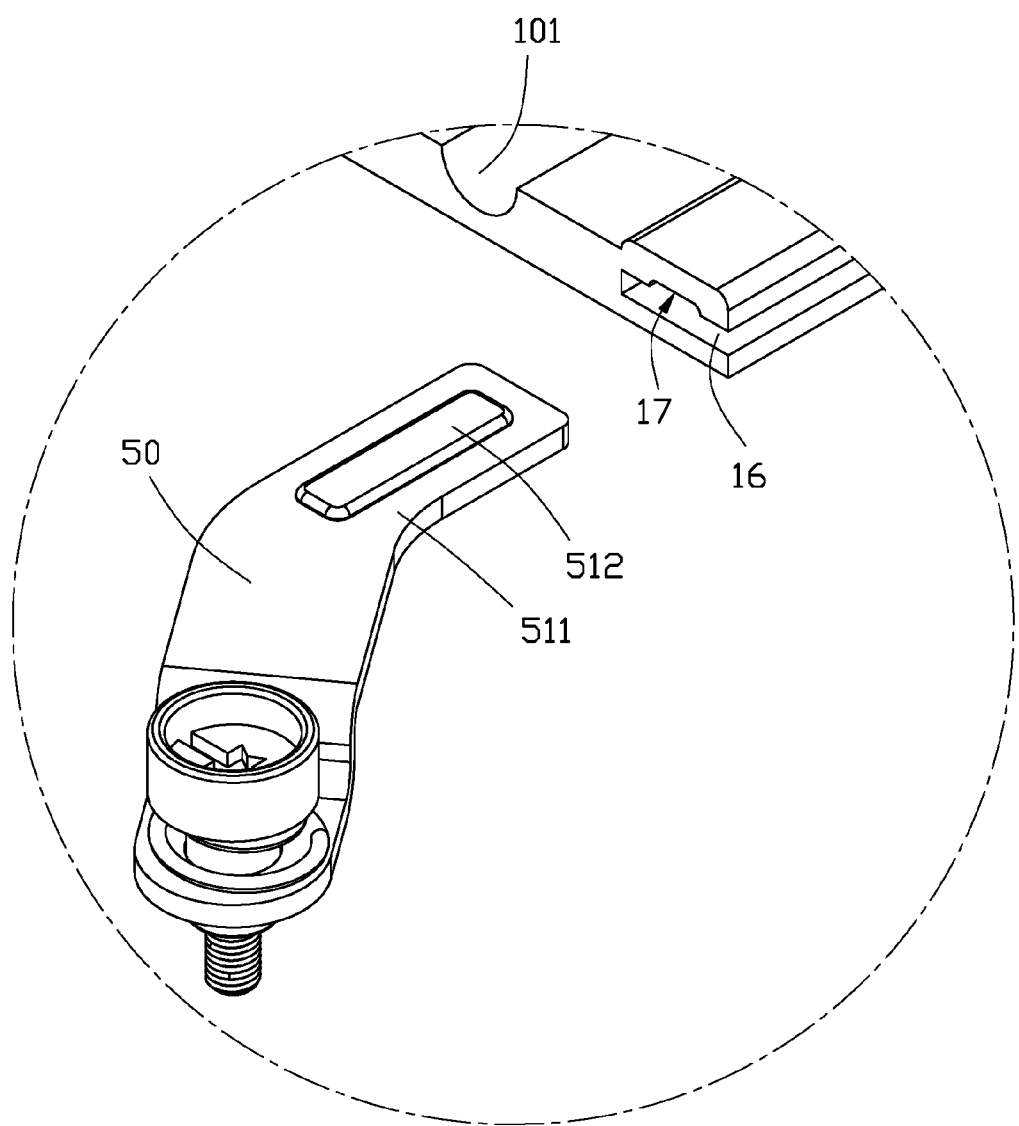
FIG. 3 is an enlarged view of a circled part III of FIG. 2.
Figure 4:
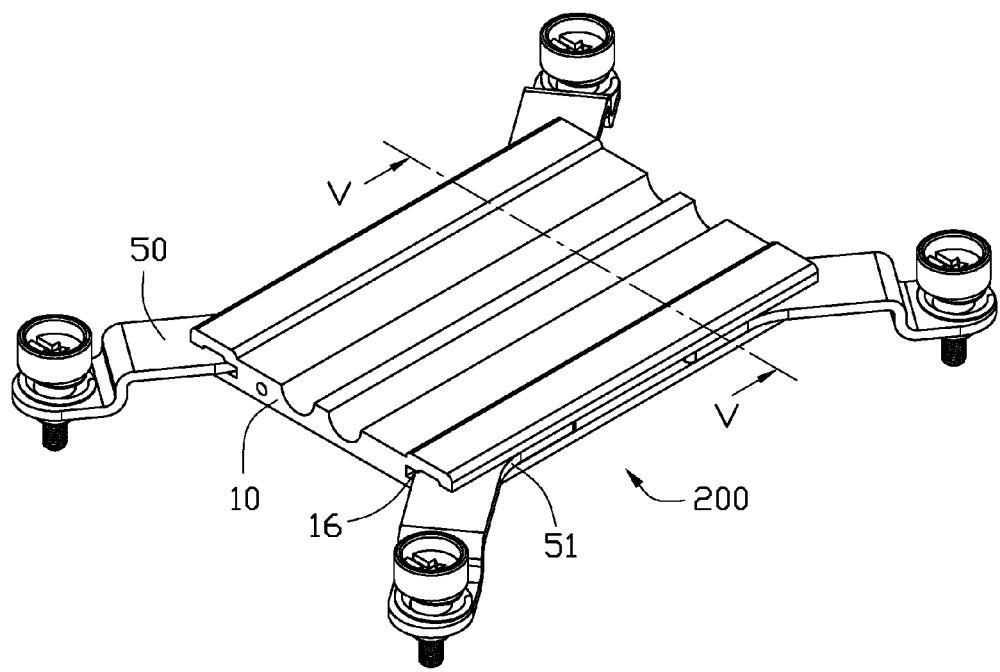
FIG. 4 is an isometric view of a preform of the base and the clips of the heat dissipating module of FIG. 1, showing the preform of the base and the clips brought together during a process of assembly of the heat dissipating module.
Figure 5:
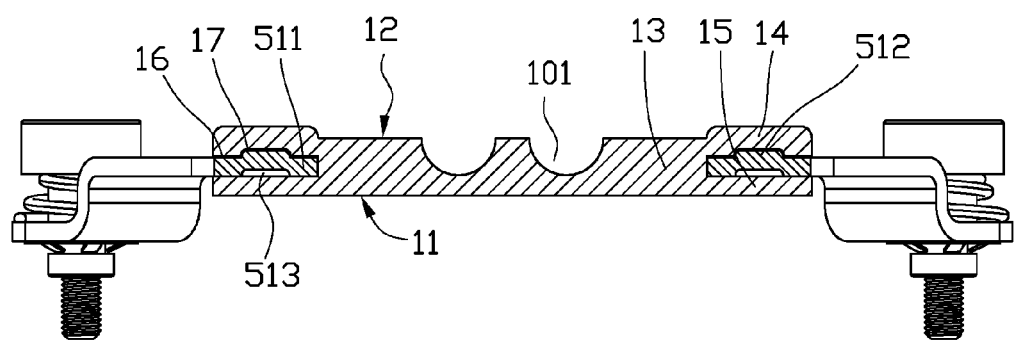
FIG. 5 is a cross sectional view taken along line V-V of FIG. 4.
Figure 6:
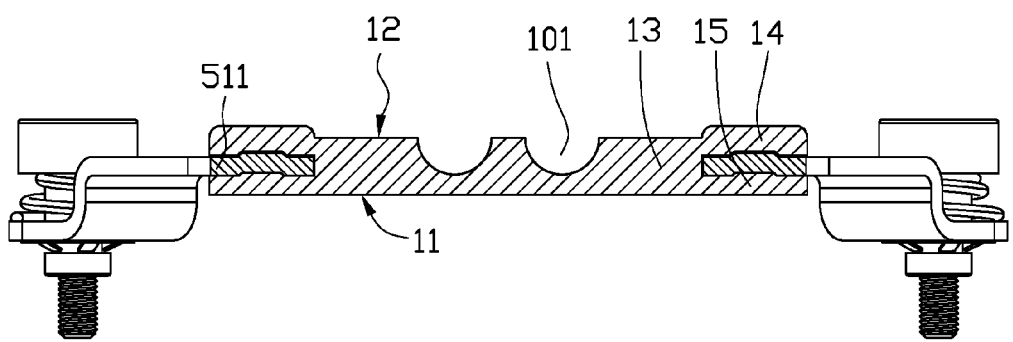
FIG. 6 is similar to FIG. 5, but showing a final form of the base after the preform of the base and the clips have been pressed together.

Referring to FIG. 2 and FIG. 3, the heat absorber 10 is a metal sheet with high thermal conductivity. The heat absorber 10 is rectangular, and includes a main body 13, a pair of top flanges 14, and a pair of bottom flanges 15. The top flanges 14 extend laterally from tops of two opposite lateral sides of the main body 13, and the bottom flanges 15 extend laterally from bottoms of the two opposite lateral sides of the main body 13. The heat absorber 10 also includes a top surface 12, and a bottom surface 11 for contacting a heat generating component (not shown) mounted on the circuit board.

Two mounting grooves 101 are formed on a top surface of the main body 13. The mounting grooves 101 are semicylindrical (or semicolumnar) shaped and arranged parallel with each other, with each mounting groove 101 aligned along a longitudinal direction of the heat absorber 10. The mounting grooves 101 are located between the pair of top flanges 14. Each top flange 14 and a corresponding bottom flange 15 located at the same lateral side of the main body 13 are spaced from and parallel to each other, and cooperatively define a receiving groove 16 therebetween. That is, two receiving grooves 16 are formed at the two opposite lateral sides of the main body 13. The receiving grooves 16 are above a level of the bottom surface 11 and below a level of the top surface 12.

Each top flange 14 extends upward slightly from the top surface of the main body 13 at the corresponding lateral side of the main body 13, and from there extends laterally and horizontally. A positioning groove 17 is defined in a bottom surface of the top flange 14, upward from the bottom surface of the top flange 14 toward a top surface of the top flange 14. The positioning groove 17 and the corresponding receiving groove 16 are communicated with each other. A transverse width of the positioning groove 17 is smaller than that of the receiving groove 16. A bottom surface of each bottom flange 15 is coplanar with a bottom surface of the main body 13. Thus, the bottom surfaces of the main body 13 and the bottom flanges 15 cooperatively constitute the bottom surface 11 of the base 200.

The fin assembly 20 is mounted on the top surface 12 of the base 200, and covers the two mounting grooves 101 and one of the top flanges 14. The fin assembly 20 includes a plurality of parallel fins 21 arranged side by side along the longitudinal direction of the base 200. Each two neighboring fins 21 are spaced apart from each other. Each fin 21 defines two receiving holes 23 in a center thereof, and two semicircular cutouts 22 at a bottom end thereof. Each fin 21 also includes two circular fin flanges 24 extending perpendicularly from circumferential edges of the two receiving holes 23, respectively, and another two semicircular fin flanges 24 extending perpendicularly from circumferential edges of the two semicircular cutouts 22, respectively. Except for a leftmost end one of the fins 21, each fin 21 further includes at least three straight fin flanges 24 extending perpendicularly from at least three straight outer edges of the fin 21, respectively. The circular fin flanges 24 and the semicircular fin flanges 24, and, where applicable, the straight fin flanges 24, all extend away from a same major side of the fin 21.

The fin flanges 24 at the circumferential edges of the receiving holes 23 of each fin 21 abut a neighboring fin 21, such that all the fins 21 cooperatively form two condensing channels 26. The fin flanges 24 at the circumferential edges of the semicircular cutouts 22 of each fin 21 abut a neighboring fin 21 and contact upper edges of the corresponding semicircular mounting grooves 101, such that all the fins 21 and the semicircular mounting grooves 101 cooperatively form two evaporating channels 25.

Each of the two heat pipes 30 is "U" shaped. Each heat pipe 30 includes an evaporation section 31, a condenser section 32 parallel with the evaporation section 31, and a connecting section 33 interconnecting the evaporation section 31 and the condenser section 32. Each evaporation section 31 is received in a corresponding evaporation channel 25. Each condenser section 32 is received in a corresponding condensing channel 26.

The fan 40 is disposed on the top surface 12 of the base 200 and covers the other top flange 14. The fan 40 is attached to one end of the fin assembly 20, for generating airflow to dissipate heat of the fin assembly 20 into the ambient air efficiently.

The clips 50 are essentially flat bars each with a downwardly offset end. In this embodiment, there are four clips 50. Each clip 50 includes a positioning beam 511 received in the receiving groove 16, and a fastening beam 52 extending from one end of the positioning beam 511. The fastening beam 52 includes the downwardly offset end. Referring to FIG. 3 through FIG. 6, a positioning block 512 is formed integrally on a top surface of the positioning beam 511 via punch pressing. A pit 513 is defined in a bottom surface of the positioning beam 511, corresponding to the positioning block 512. Thus, during assembly, a gap is defined between the positioning beam 511 and a corresponding bottom flange 15 before a pressing operation is performed. A transverse width of the positioning beam 511 is substantially equal to that of the corresponding receiving groove 16. A transverse width of the positioning block 512 is substantially equal to that of the corresponding positioning groove 17.

The fastening beam 52 extends from the end of the positioning beam 51 and is exposed out of the base 200. The downwardly offset end of the fastening beam 52 defines a through hole 521. A screw 522 can be extended through the through hole 521 to fasten the heat dissipation module 100 to the circuit board.

When the heat dissipating module 100 is assembled, the positioning beam 511 of each clip 50 is slid horizontally into one end of the corresponding receiving groove 16, with the positioning block 512 being slid horizontally into the corresponding positioning groove 17. Then the base 200 is pressed by a press. As a result, referring to FIG. 6, the positioning block 512 is embedded in the positioning groove 17, and the corresponding bottom flange 15 of the base 200 is deformed slightly to become embedded and interferingly fixed in the pit 513. That is, top surfaces of the positioning beam 511 and the positioning block 512 firmly contact the bottom surface of the top flange 14 and a bottom surface of the positioning groove 17, respectively; and the bottom surface of the positioning beam 511 firmly contacts a top surface of the bottom flange 15.

Then the evaporation section 31 of each heat pipe 30 is received in the corresponding evaporating channel 25, and the condenser section 32 of each heat pipe 30 is received in the corresponding condensing channel 26. The fin assembly 20 is mounted on the top surface of the base 200 by soldering. The fan 40 is attached to one end of the fin assembly 20 by conventional means. Finally, the heat dissipating module 100 is disposed on the circuit board with the screws 522 extending through the through holes 521 of the clips 50 and being engaged with the circuit board.

Since the heat dissipating module 100 includes the heat absorber 10 defining the receiving grooves 16 and the positioning grooves 17, the positioning beam 511 of each clip 50 is received in the corresponding receiving groove 16 and sandwiched between the corresponding top flange 14 and the corresponding bottom flange 15, with the positioning block 512 embedded in the corresponding positioning groove 17 and the bottom flange 15 deformed and interferingly fixed in the pit 513. As such, the positioning beam 511 of each clip 50 is fixed in the receiving groove 16 of the heat absorber 10 and is immovable along horizontal directions and along vertical directions. The clips 50 firmly contact the heat absorber 10 without screws, and the connection between the clips 50 and the heat absorber 10 is as stable as or even more stable than that achieved using conventional screws. The heat dissipation efficiency of the heat dissipating module 100 is high. In addition, the cost of manufacturing and assembling the heat dissipating module 100 can be reduced.

Figure 7:
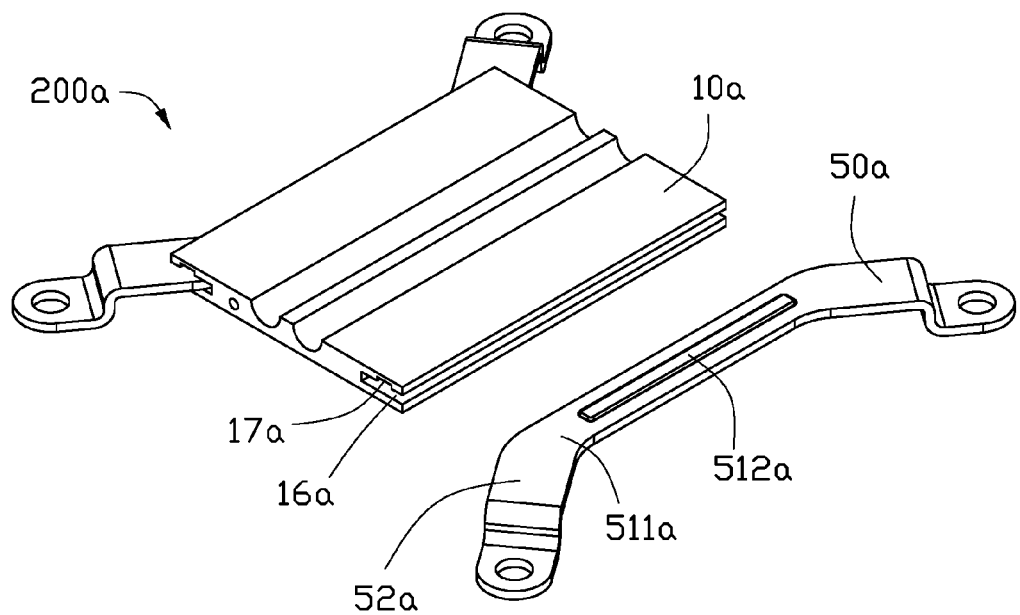
FIG. 7 is a partly assembled, isometric view of a base of a heat dissipating module, in accordance with a second embodiment of the disclosure.
Figure 8:
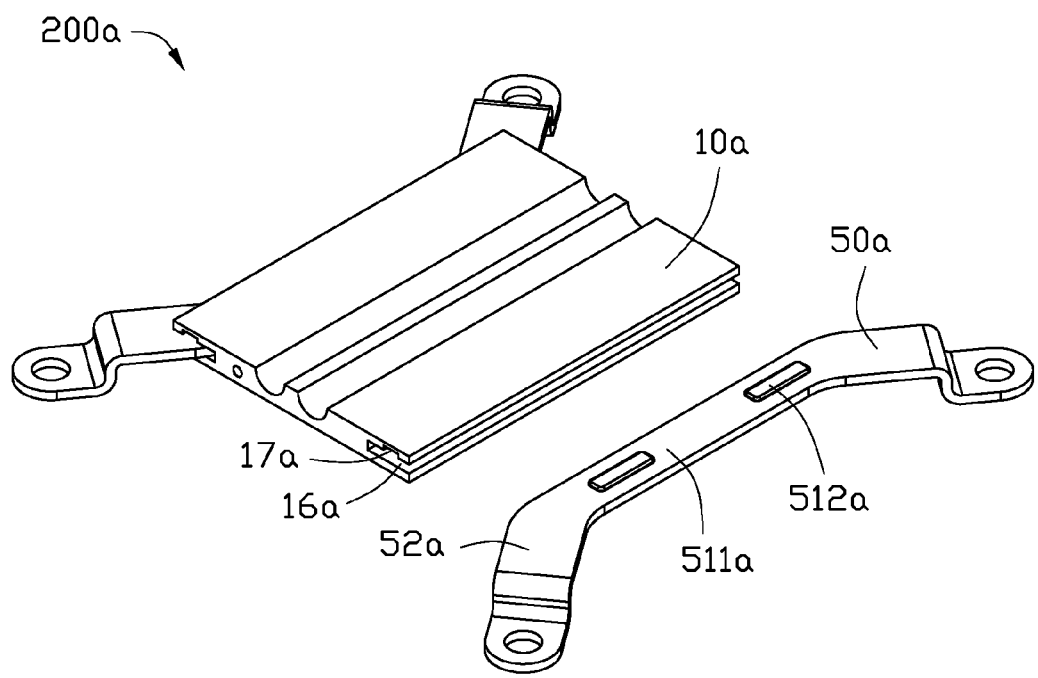
FIG. 8 is similar to FIG. 7, but showing a variation of the second embodiment.

Referring to FIG. 7, a base 200a in accordance with a second exemplary embodiment is shown. The base 200a includes a heat absorber 10a and a pair of clips 50a. The heat absorber 10a is the same as the heat absorber 10 of the first embodiment. Each clip 50a includes a positioning beam 511a received in a corresponding receiving groove 16a, and two fastening beams 52a extending from two opposite ends of the positioning beam 511a and exposed out of the heat absorber 10a. In this embodiment, the clip 50a is approximately "V" shaped. A length of the positioning beam 511a is approximately equal to or slightly less than that of the receiving groove 16a. A positioning block 512a is embedded in a corresponding positioning groove 17a. Referring to FIG. 8, alternatively, a length of the positioning block 512a can be much smaller than that of the receiving groove 16a. In addition, more than one positioning block 512a can be formed on the positioning beam 511a. In FIG. 8, two positioning blocks 512a are shown. The positioning blocks 512a are spaced from each other and are embedded in the positioning groove 17a.

Figure 9:
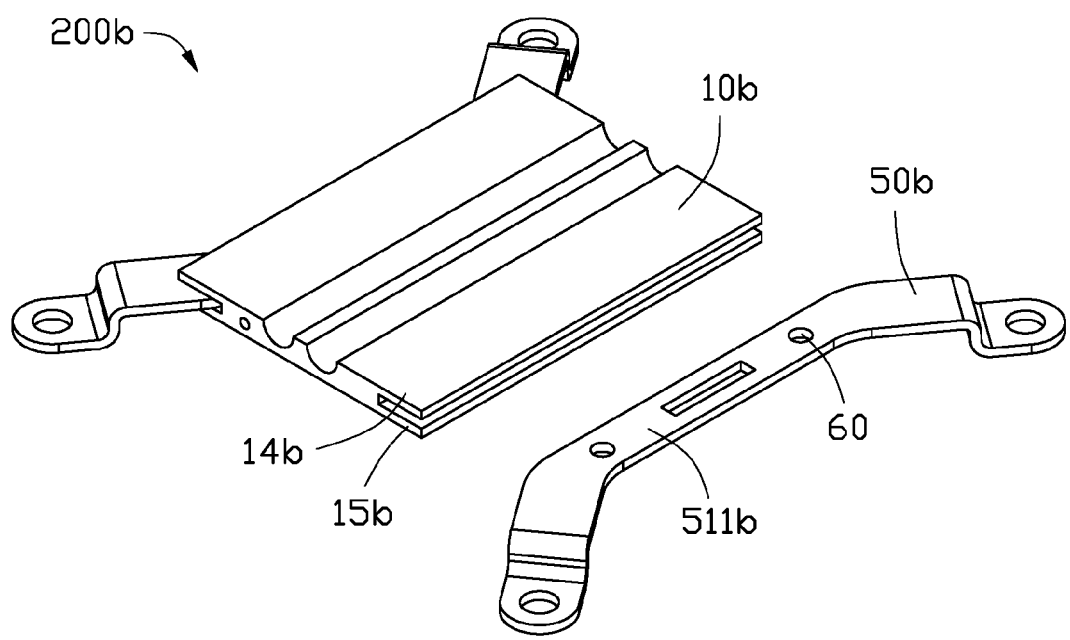
FIG. 9 is a partly assembled, isometric view of a base of a heat dissipating module, in accordance with a third embodiment of the disclosure.
Figure 10:
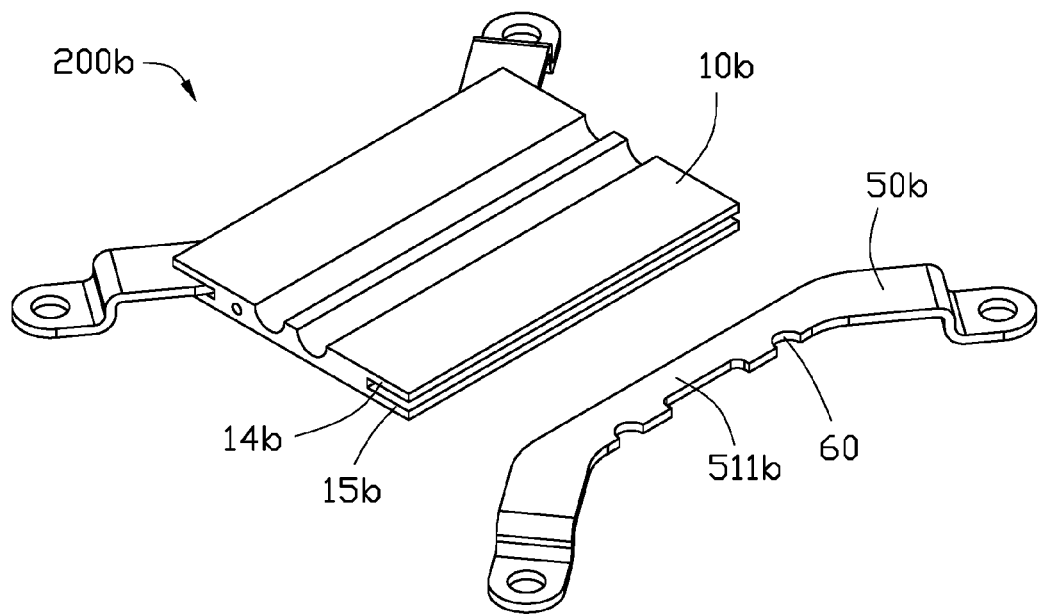
FIG. 10 is similar to FIG. 9, but showing a variation of the third embodiment.

Referring to FIG. 9, a base 200b in accordance with a third exemplary embodiment is shown. The base 200b includes a heat absorber 10b and a pair of clips 50b. The heat absorber 10b is similar to the heat absorber 10 of the first embodiment, but does not have any positioning grooves 17. A plurality of positioning holes 60 is defined in a positioning beam 511b of each clip 50b. Top flanges 14b and bottom flanges 15b are completely flat. In particular, a top surface of each top flange 14b is coplanar with a top surface of the heat absorber 10b. When the base 200b is pressed, for each clip 50b, portions of the top flange 14b and the bottom flange 15b corresponding to the positioning holes 60 are deformed slightly to become embedded and interferingly fixed in the positioning holes 60. Alternatively, the positioning holes 60 can be formed at a lateral edge of the positioning beam 511 of each clip 50b, as shown in FIG. 10. That is, the positioning holes 60 are in the form of breaches in lateral edge of the positioning beam 511, for strengthening the pressing force between the heat absorber 10b and the clip 50b when the base 200b is assembled.

It is to be understood that the above-described embodiments are intended to illustrate rather than limit the disclosure. Variations may be made to the embodiments without departing from the spirit of the disclosure. The above-described embodiments illustrate the scope of the disclosure but do not restrict the scope of the disclosure.

What is claimed is:

1. A base, comprising:
    a heat absorber, the heat absorber comprising a top surface and a bottom surface, the heat absorber comprising a main body, a pair of top flanges extending from the main body and located adjacent to the top surface, and a pair of bottom flanges extending from the main body and located adjacent to the bottom surface, a pair of receiving grooves being defined in opposite lateral sides of the heat absorber, respectively, each receiving groove located above a level of the bottom surface and below a level of the top surface; and
    two clips attached to the heat absorber, each clip comprising a positioning beam and at least one positioning block located on the positioning beam, the positioning beam being received in a corresponding one of the receiving grooves with a portion of the heat absorber adjacent to the positioning beam deformed and fixed to the positioning beam thereby fixing the positioning beam in the receiving groove;
    wherein each receiving groove is defined between one top flange and one corresponding bottom flange;
    wherein a positioning groove is defined in one of the top flange and the bottom flange, the positioning groove communicating with the receiving groove; and
    wherein the at least one positioning block is fixed in the positioning groove.

2. The base of claim 1, wherein the plurality of clips is two clips, each clip being embedded in one of the receiving grooves, each clip further comprising two fastening beams extending from two opposite ends of the positioning beam and being exposed out of the heat absorber, the clip being approximately "V" shaped.

3. A heat dissipating module, comprising:
    a base, the base comprising a heat absorber and a plurality of clips attached to the heat absorber, the heat absorber comprising a top surface and a bottom surface, the heat absorber comprising a main body, a pair of top flanges extending from the main body and located adjacent to the top surface, and a pair of bottom flanges extending from the main body and located adjacent to the bottom surface, a pair of receiving grooves being defined in opposite lateral sides of the heat absorber, respectively, each receiving groove located above a level of the bottom surface and below a level of the top surface, each clip comprising a positioning beam and a positioning block located on the positioning beam, the positioning beam being received in a corresponding one of the receiving grooves with a portion of the heat absorber adjacent to the positioning beam deformed and fixed to the positioning beam thereby fixing the positioning beam in the receiving groove;
    a fin assembly mounted on the base; two heat pipes, each heat pipe comprising an evaporation section and a condenser section, the evaporation section contacting the top surface of the heat absorber and a bottom surface of the fin assembly, the condenser section extending through and in thermal contact with the fin assembly; and
    a fan attached to one end of the fin assembly;
    wherein each receiving groove is defined between one top flange and one corresponding bottom flange;
    wherein a positioning groove is defined in one of the top flange and the bottom flange, the positioning groove communicating with the receiving groove; and
    wherein the positioning block is fixed in the positioning groove.

4. The heat dissipating module of claim 3, wherein the plurality of clips is two clips, each clip being embedded in one of the receiving grooves, each clip further comprising two fastening beams extending from two opposite ends of the positioning beam and being exposed out of the heat absorber, the clip being approximately "V" shaped.

* * * * *